US011997839B2

(12) United States Patent
Waddell et al.

(10) Patent No.: US 11,997,839 B2
(45) Date of Patent: May 28, 2024

(54) HEAT DISSIPATION SYSTEM AND AN ASSOCIATED METHOD THEREOF

(71) Applicant: General Electric Company, Schenectady, NY (US)

(72) Inventors: Alistair Martin Waddell, Bavaria (DE); Mark Aaron Chan Chan, Bavaria (DE); Owen Jannis Schelenz, Berlin (DE); Michael Fernahl, Brandenburg (DE)

(73) Assignee: GE Grid Solutions LLC, Atlanta, GA (US)

( * ) Notice: Subject to any disclaimer, the term of this patent is extended or adjusted under 35 U.S.C. 154(b) by 9 days.

(21) Appl. No.: 17/452,509

(22) Filed: Oct. 27, 2021

(65) Prior Publication Data

US 2022/0053673 A1 Feb. 17, 2022

Related U.S. Application Data

(63) Continuation of application No. 15/639,674, filed on Jun. 30, 2017, now Pat. No. 11,252,847.

(51) Int. Cl.
*H05K 7/20* (2006.01)
*F28D 15/02* (2006.01)
*H01L 23/427* (2006.01)

(52) U.S. Cl.
CPC ..... *H05K 7/20936* (2013.01); *F28D 15/0266* (2013.01); *H01L 23/427* (2013.01);
(Continued)

(58) Field of Classification Search
CPC .. H05K 7/2029; H05K 7/203; H05K 7/20309; H05K 7/20254; H05K 7/20318;
(Continued)

(56) References Cited

U.S. PATENT DOCUMENTS 7,791,885 B2    9/2010 Agostini et al.
8,711,565 B2    4/2014 Wagoner et al.
(Continued)

FOREIGN PATENT DOCUMENTS

CN    103335549 A    6/2015
EP    2291067 A1     3/2011
(Continued)

OTHER PUBLICATIONS

European Extended Search Report and Written Opinion issued in connection the European Application No. 18179019.7 dated Nov. 15, 2018.
(Continued)

*Primary Examiner* — Zhengfu J Feng
(74) *Attorney, Agent, or Firm* — Armstrong Teasdale LLP

(57) ABSTRACT

Heat dissipation system, a power converter using such a heat dissipation system, and an associated method of thermal management of the power converter are disclosed. The heat dissipation system includes a condenser, a first cooling loop, and a second cooling loop. The first cooling loop is coupled to the condenser and includes a first two-phase heat transfer device. The second cooling loop is coupled to the condenser and includes a second two-phase heat transfer device. The condenser is disposed above the first and second two-phase heat transfer devices.

19 Claims, 6 Drawing Sheets

(52) U.S. Cl.
CPC ....... *H05K 7/20254* (2013.01); *H05K 7/2029* (2013.01); *H05K 7/20309* (2013.01); *H05K 7/20318* (2013.01); *H05K 7/20336* (2013.01); *H05K 7/2039* (2013.01); *H05K 7/20663* (2013.01); *H05K 7/203* (2013.01); *H05K 7/20327* (2013.01); *H05K 7/208* (2013.01)

(58) Field of Classification Search
CPC ........... H05K 7/20327; H05K 7/20336; H05K 7/2039; H05K 7/20663; H05K 7/208; H05K 7/20936; F28D 15/0266; H01L 23/427
USPC ....................................................... 361/700
See application file for complete search history.

(56) References Cited

U.S. PATENT DOCUMENTS

| | | | |
|---|---|---|---|
| 8,763,681 B2 | 7/2014 | Agostini et al. | |
| 8,913,386 B2 | 12/2014 | Gradinger et al. | |
| 9,032,743 B2 | 5/2015 | Agostini et al. | |
| 9,113,579 B2 | 8/2015 | Cottet et al. | |
| 2004/0012983 A1* | 1/2004 | Fearing | H05K 7/209 |
| | | | 363/16 |
| 2008/0078202 A1 | 4/2008 | Luo | |
| 2008/0251245 A1* | 10/2008 | Gorbounov | F25B 39/028 |
| | | | 165/178 |
| 2009/0038780 A1 | 2/2009 | Liu | |
| 2009/0158757 A1 | 6/2009 | Marsala | |
| 2009/0284926 A1 | 11/2009 | Agostini et al. | |
| 2012/0024497 A1 | 2/2012 | Kroliczek et al. | |
| 2012/0324933 A1* | 12/2012 | Louvar | H05K 7/20327 |
| | | | 62/196.4 |
| 2013/0077245 A1* | 3/2013 | Gradinger | F28D 1/035 |
| | | | 165/170 |
| 2013/0312937 A1* | 11/2013 | Tsukinari | H05K 7/20936 |
| | | | 165/104.21 |
| 2013/0340978 A1 | 12/2013 | Agostini et al. | |
| 2014/0252864 A1 | 9/2014 | Kulkarni et al. | |
| 2014/0338778 A1 | 11/2014 | Li et al. | |
| 2015/0003015 A1 | 1/2015 | Kulkarni et al. | |
| 2015/0135746 A1 | 5/2015 | Louvar | |
| 2015/0181756 A1* | 6/2015 | Sato | H01L 23/427 |
| | | | 165/64 |
| 2015/0216079 A1* | 7/2015 | Kondou | F28F 1/40 |
| | | | 165/104.21 |
| 2015/0257303 A1* | 9/2015 | Shedd | F25B 41/20 |
| | | | 62/62 |
| 2015/0359133 A1* | 12/2015 | Joshi | H05K 7/2039 |
| | | | 165/287 |
| 2016/0047605 A1 | 2/2016 | Mishkinis et al. | |
| 2016/0165752 A1* | 6/2016 | Pietrantonio | H05K 7/20927 |
| | | | 165/121 |
| 2016/0200165 A1* | 7/2016 | France | H01L 23/36 |
| | | | 165/51 |
| 2016/0258691 A1 | 9/2016 | Wang et al. | |
| 2018/0059746 A1* | 3/2018 | Sato | H05K 7/20836 |
| 2018/0098459 A1* | 4/2018 | Chainer | H05K 7/20272 |
| 2018/0249596 A1* | 8/2018 | Asai | H05K 7/20927 |

FOREIGN PATENT DOCUMENTS

| | | | | |
|---|---|---|---|---|
| EP | 3193571 A1 | | 7/2017 | |
| EP | 3524915 B1 | * | 12/2021 | ............... F25B 1/00 |
| WO | 2006019767 A1 | | 2/2006 | |
| WO | 2017066993 A1 | | 4/2017 | |
| WO | WO-2018066066 A1 | * | 4/2018 | ............... F25B 1/00 |

OTHER PUBLICATIONS

Nilpueng et al., "Two-Phase Gas-Liquid Flow Characteristics Inside a Plate Heat Exchanger", Experimental Thermal and Fluid Science, http://www.sciencedirect.com/science/article/pii/S0894177710001020, vol. 34, Issue 8, Nov. 2010, pp. 1217-1229.
Agostini et al., "Flexible Two-Phase Termosyphon for Power Electronic Cooling", IEEE 33rd International Telecommunications Energy Conference (INTELEC), Oct. 9-13, 2011, pp. 6.
Ouchi et al., "Thermal Management Systems for Data Centres with Liquid Coolling Technique of CPU", 13th IEEE Intersociety Conference on Thermal and Thermo Mechanical Phenomena in Electronic Systems (ITerm), May 30-Jun. 1, 2012; pp. 9.
Moreno et al., "Passive Two-Phase Cooling for Automotive Power Electronics", 30th Annual Semiconductor Thermal Measurement and Management Symposium (SEMI-THERM), Mar. 9-13, 2014, pp. 8.
Yamaguchi et al., "Study of HTS Machine System Cooling With a Closed-Loop Thermosyphon; Stability of Unsteady Heat Load and Transient Conduction", IEEE Transactions on Applied Superconductifity, http://ieeexplore.ieee.org/document/7422744/, vol. 26, Issue 3, Article No. 5204405, Apr. 2016, pp. 5.
Parida et al., "Modeling Embedded Two-Phase Liquid Cooled High Power 3D Compatible Electronic Devices", 33rd Thermal Measurement, Modeling & Management Symposium (SEMI-THERM), Mar. 13-17, 2019, 9 pgs.

* cited by examiner

HEAT DISSIPATION SYSTEM AND AN ASSOCIATED METHOD THEREOF

CROSS REFERENCE TO RELATED APPLICATIONS

This application is a continuation and claims priority to U.S. patent application Ser. No. 15/639,674 filed Jun. 30, 2017, entitled HEAT DISSIPATION SYSTEM AND AN ASSOCIATED METHOD THEREOF, the entire disclosure of which is incorporated herein by reference.

BACKGROUND

Embodiments of the present invention relate generally to a heat dissipation system and more particularly to a power converter system using the heat dissipation system and a method of thermal management of the power converter.

Many known semiconductor devices (e.g., rectifiers and inverters) are used for conversion of electric power. Rectifiers are used for converting alternating current (AC) to direct current (DC) and inverters are used for converting DC current to AC current. Typically, rectifiers and inverters are integrated into full power conversion assemblies (i.e., power converters) used in renewable electric power generation facilities such as solar power generation farms and wind turbine farms. The semiconductor devices typically generate large amount of heat during operation of the power converters. At least some known power converters use a liquid cooling system that may be coupled to main components such as power electronic components of the semiconductor devices for cooling the main components. Such a liquid cooling system may not be employed for cooling certain auxiliary components such as inductors and bus bars laminates of the semiconductor devices and for cooling air within the power converter, because of high cost involved and complexity in implementation. Further, the liquid cooling system includes an active pump for pumping a working liquid in the liquid cooling system for cooling the semiconductor devices. In such a system, maintaining a flow rate of the working liquid in two or more branches of the liquid cooling system may be problematic due to high resistance to a flow of the working liquid in some branches in comparison to low resistance to the flow of the working liquid in other branches.

Thus, there is a need for an improved heat dissipation system and an improved thermal management of a power converter using such a heat dissipation system.

BRIEF DESCRIPTION

In accordance with one exemplary embodiment of the present invention, a heat dissipation system is disclosed. The heat dissipation system includes a condenser, a first cooling loop, and a second cooling loop. The first cooling loop is coupled to the condenser and includes a first two-phase heat transfer device. The second cooling loop is coupled to the condenser and includes a second two-phase heat transfer device. The condenser is disposed above the first and second two-phase heat transfer devices.

In accordance with another exemplary embodiment of the present invention, a power converter is disclosed. The power converter includes a sealed casing, a first component, a second component, and a heat dissipation system. The first and second components are disposed within the sealed casing. The heat dissipation system includes a condenser, a first cooling loop, and a second cooling loop. The condenser is disposed outside the sealed casing. The first cooling loop is coupled to the condenser and includes a first two-phase heat transfer device disposed within the sealed casing and coupled to the first component. The second cooling loop is coupled to the condenser and includes a second two-phase heat transfer device disposed within the sealed casing and coupled to the second component. The condenser is disposed above the first and second two-phase heat transfer devices.

In accordance with yet another exemplary embodiment of the present invention, a method for thermal management of a power converter is disclosed. The method involves directing a first portion of a single-phase fluid from a condenser to a first two-phase heat transfer device of a first cooling loop. The single-phase fluid comprises a liquid medium. The method further involves directing a second portion of the single-phase fluid from the condenser to a second two-phase heat transfer device of a second cooling loop. Further, the method involves dissipating heat from a first component to the first portion of the single-phase fluid via the first two-phase heat transfer device and produce a first portion of a two-phase fluid. The two-phase fluid includes the liquid medium and a gaseous medium. Further, the method involves dissipating heat from a second component to the second portion of the single-phase fluid via the second two-phase heat transfer device and produce a second portion of the two-phase fluid. The method further involves pumping the first portion of the two-phase fluid from the first two-phase heat transfer device to the condenser and second portion of the two-phase fluid from the second two-phase heat transfer device to the condenser. The first and second components and the first and second two-phase heat transfer devices are disposed within a sealed casing. The condenser is disposed outside the sealed casing and above the first and second two-phase heat transfer devices.

DRAWINGS

These and other features and aspects of embodiments of the disclosed technique will become better understood when the following detailed description is read with reference to the accompanying drawings in which like characters represent like parts throughout the drawings, wherein.

DETAILED DESCRIPTION

Figure 1:
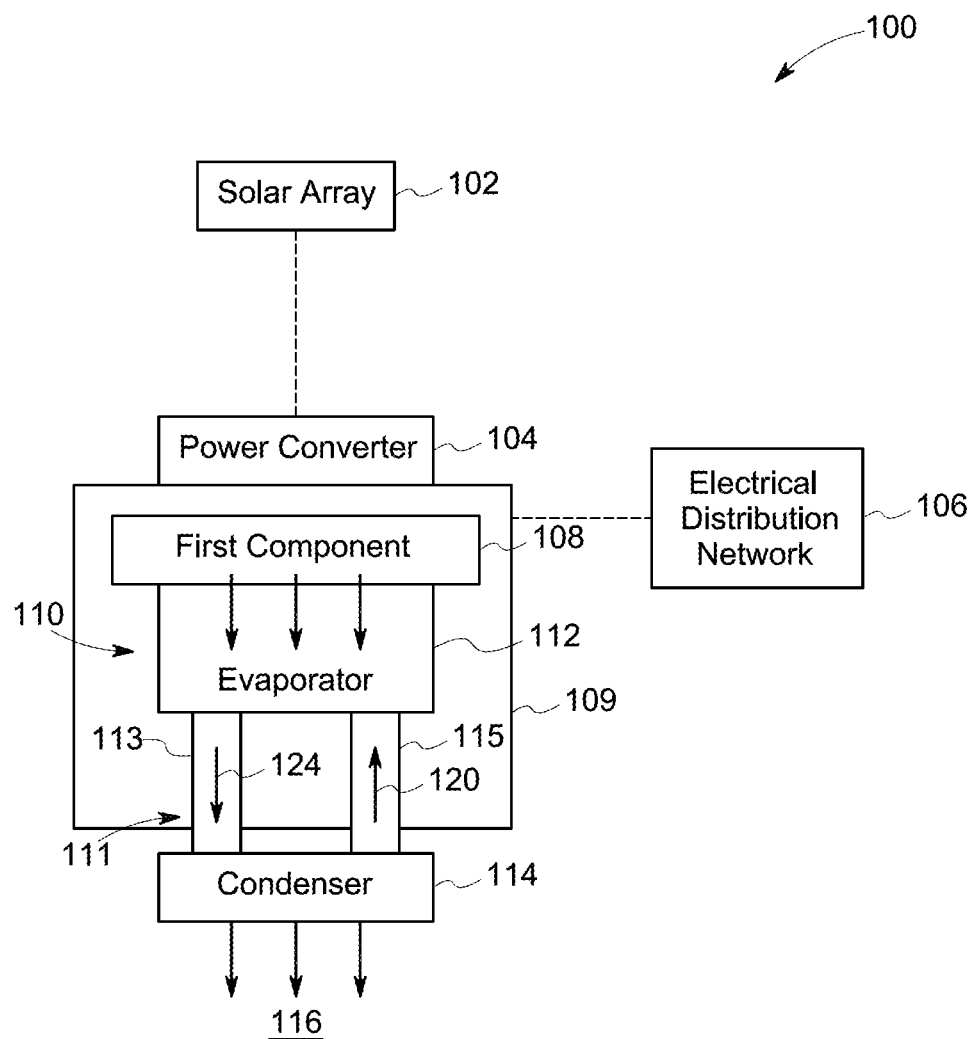
FIG. 1 is a schematic block diagram of a power generation system in accordance with one embodiment.

Embodiments discussed herein disclose a heat dissipation system such as a thermosiphon including a plurality of cooling loops, where each cooling loop including at least one two-phase heat transfer device. In one embodiment, such a heat dissipation system may be used for thermal management of a power converter. In some other embodiments, the heat dissipation system may be used for thermal management of a hermetically sealed motor or the like. In one embodiment, the heat dissipation system includes a condenser, a first cooling loop, and a second cooling loop. The first cooling loop is coupled to the condenser and includes a first two-phase heat transfer device. The second cooling loop is coupled to the condenser and includes a second two-phase heat transfer device. The condenser is disposed above the first and second two-phase heat transfer devices. It should be noted herein that the term "above" as used herein means the condenser is physically located at a higher location with respect to the first and second heat transfer devices. In certain embodiments, the first cooling loop includes a first conduit extending from a downstream end of the condenser to an upstream end of the first two-phase heat transfer device and a second conduit extending from a downstream end of the first two-phase heat transfer device to an upstream end of the condenser. Similarly, the second cooling loop includes a third conduit extending from the downstream end of the condenser to an upstream end of the second two-phase heat transfer device and a fourth conduit extending from a downstream end of the second two-phase heat transfer device to the upstream end of the condenser. In such an embodiment, the first and second conduits, and the third and fourth conduits are disposed parallel to each other. Further, such a heat dissipation system may further include at least one of a first intermediate conduit coupled to the first and second conduits and a second intermediate conduit coupled to the third and fourth conduits for controlling head height of a two-phase fluid in the second and fourth conduits. It should be noted herein that the term "controlling head height" may refer to "controlling pressure head of a fluid". In some embodiments, the second cooling loop may further include a single-phase heat transfer device coupled to and disposed upstream relative to the second two-phase heat transfer device.

In one embodiment, the heat dissipation system is used for thermal management of a power converter used for converting direct current (DC) to alternating current (AC) or vice versa. Specifically, the power converter may include one or more components, for example, electrical and/or electronic components, for converting the DC power to AC power. The one or more components may generate heat during the process of power conversion. In some embodiments, the two-phase heat transfer device in each of the first and second cooling loops is coupled to the one or more components for extracting heat from the one or more components. In some embodiments, the single-phase fluid transfer device is coupled to some auxiliary components such as inductors and bus bar laminates for extracting heat from such auxiliary components. In some other embodiments, the single-phase fluid transfer device is used to cool a fluid within the power converter.

In some embodiments, at least one of the first and second two-phase heat transfer devices includes an evaporator. In some other embodiments, at least one of the first and second two-phase heat transfer devices is an evaporator. In one embodiment, the evaporator is used to i) extract heat from the one or more components and produce a two-phase fluid, and ii) pump the two-phase fluid passively to the condenser. In such an embodiment, the evaporator includes a supply housing, a receiving housing, and at least one expansion housing extending between the supply housing and the receiving housing. The at least one expansion housing includes a flow inlet defined at the supply housing and a flow outlet defined at the receiving housing. In one embodiment, the flow inlet has a first size and the flow outlet has a second size larger than the first size. It should be noted herein that the term "size" may refer to a diameter or a width of the inlet or the outlet of the expansion housing. In one or more embodiments, the condenser is used to receive the two-phase fluid from at least one of the first and second two-phase heat transfer devices and dissipate the extracted heat to an ambient atmosphere to produce a single-phase fluid. It should be noted herein that the term "single-phase fluid" may refer to a liquid medium. Similarly, the term "two-phase fluid" may refer to a mixture of liquid and gaseous mediums.

In one or more embodiments, the heat dissipation system including at least one two-phase heat transfer device in each of the first and second cooling loops, passively maintains a flow rate of the single-phase fluid and the two-phase fluid in each of the first and second cooling loops without incurring pressure losses. Further, the heat dissipation system includes the single-phase heat transfer device coupled to the at least one cooling loop and disposed upstream relative to the corresponding two-phase fluid transfer device. The heat dissipation system extracts heat from at least one of the auxiliary components and/or the fluid of the power converter for complete thermal management of a power converter.

In some other embodiments, the heat dissipation system may further include a third cooling loop coupled to the condenser and having a third two-phase heat transfer device. In such an embodiment, the third cooling loop further includes a single-phase heat transfer device coupled to and disposed upstream relative to the third two-phase heat transfer device.

FIG. 1 illustrates schematic block diagram of a power generation system 100 in accordance with one embodiment of the present invention. The power generation system 100 includes one or more power generation units, such as a solar array 102 formed from a plurality of solar panels (not shown in FIG. 1). Alternatively, the power generation system 100 may include any suitable number and type of power generation units, such as a plurality of wind turbines, fuel cells, geothermal generators, hydropower generators, and/or other devices that generate power from renewable and/or non-renewable energy sources.

In one embodiment, the solar array 102 may include any number of solar panels that enable the operation of the power generation system 100 to generate a desired power output. In one embodiment, the plurality of solar panels of the solar array 102 may be coupled together in a series-parallel configuration to enable generation of desired current and/or voltage output from the power generation system 100. The solar panels may include one or more of a photovoltaic panel, a solar thermal collector, or any other device that converts solar energy to electrical energy. In one embodiment, the solar panels of the solar array 102 are photovoltaic panels that generate direct current (DC) power resulting from received solar energy.

In one embodiment, the solar array 102 is coupled to a power conversion assembly, such as a power converter 104, that converts DC power to alternating current (AC) power. In certain embodiments, the power converter 104 includes a sealed casing 109 and one or more components 108, for example, an electrical component and/or an electronic component disposed within the sealed casing 109. For ease of illustration, the power converter 104 is shown to have one first component 108. Such an illustration should not be construed as a limitation of the disclosed technique. The first component 108 is used for converting the DC power to the AC power. The first component 108 may include one or more semiconductor devices, such as a DC-AC inverter (not shown) that converts DC power received from the solar array 102 into AC power for transmission to an electrical distribution network 106. The power converter 104 adjusts an amplitude of voltage and/or current of the converted AC power to an amplitude suitable for use by an electrical distribution network 106. The power converter 104 provides the AC power at a frequency and a phase that are substantially equal to the frequency and phase of the electrical distribution network 106. In the illustrated embodiment, the power converter 104 provides three-phase AC power to the electrical distribution network 106. Alternatively, the power converter 104 may provide single phase AC power to the electrical distribution network 106. Typically, heat is generated by the first component 108 during operation of the power converter 104.

The power converter 104 further includes a heat dissipation system 110 such as a thermosiphon configured to dissipate the heat from the first component 108. In one embodiment, the heat dissipation system 110 includes a first cooling loop 111 and a condenser 114. The condenser 114 is disposed outside the sealed casing 109. Further, the first cooling loop 111 includes a first two-phase heat transfer device 112 disposed within the sealed casing 109. For ease of illustration, the heat dissipation system 110 is shown to have only one cooling loop 111 and only one two-phase heat transfer device 112. Such an illustration should not be construed as a limitation of the embodiment of the present invention. In some embodiments, the condenser 114 is located physically above a first two-phase heat transfer device 112. In certain embodiments, the condenser 114 may be located above the first two-phase heat transfer device 112 to create a free pumping effect. As the bubbles (i.e., two-phase fluid 124) are generated from the heat transfer devices (i.e., first two-phase heat transfer device 112), the bubbles floats from the heat transfer device 112 disposed at a lower location to the condenser 114 located at a higher location, where the bubbles condense back to liquid form (i.e., single-phase fluid 120) and discharged back downwards into the first two-phase heat transfer device 112. In other words, if the condenser 114 is located below the first two-phase heat transfer device 112, the heat dissipation system 110 may not work properly. In one embodiment, the first cooling loop 111 includes an inlet conduit 113 extending from the first two-phase heat transfer device 112 to the condenser 114 through the sealed casing 109 and an outlet conduit 115 extending from the condenser 114 to the first two-phase heat transfer device 112 through the sealed casing 109. In one or more embodiments, the first two-phase heat transfer device 112 is an evaporator which is thermally coupled to the first component 108. In such an embodiment, the inlet conduit 113 extends from a downstream end of the first two-phase heat transfer device 112 to an upstream end of the condenser 114. Further, the outlet conduit 115 extends from a downstream end of the condenser 114 to an upstream end of the first two-phase heat transfer device 112. The first two-phase heat transfer device 112 is coupled in flow communication with the condenser 114 for dissipating heat generated by the first component 108 to an ambient environment 116, for example.

In some embodiments, the first two-phase heat transfer device 112, the inlet conduit 113, and the outlet conduit 115 are hermetically joined to the condenser 114. Further, the first two-phase heat transfer device 112 is hermetically sealed in the sealed casing 109 and pre-filled with a fluid which is at a saturated liquid condition. In such an embodiment, the fluid may include, but not limited to, inert gas, nitrogen, argon, and the like. Further, in such an embodiment, a single-phase fluid 120 and a two-phase fluid 124 may be refrigerants with boiling point less than 0 degree centigrade at atmospheric pressures. For example, the refrigerants may include r134a, r1234yf, and the like. In some other embodiments, the first two-phase heat transfer device 112, the inlet conduit 113, and the outlet conduit 115 may not be hermetically joined to the condenser 114. Further, the first two-phase heat transfer device 112 may not be hermetically sealed in the sealed casing 109. In such an embodiment, the sealed casing 109 may be pre-filled with a fluid having a boiling point below a predefined threshold temperature of the first component 108 at atmospheric pressure. In one embodiment, the fluid may include, but not limited to, air, and the like. Further, in such an embodiment, the single-phase fluid 120 and the two-phase fluid 124 may be coolant with boiling point in range from about zero degree centigrade to about 70 degree centigrade at atmospheric pressure. For example, the coolant may include Novec649, HFE7000, SES30, and the like.

During operation, the heat dissipation system 110 is used to direct a single-phase fluid 120 from the condenser 114 to the first two-phase heat transfer device 112 via the outlet conduit 115. The first two-phase heat transfer device 112 is used to extract the heat from the first component 108 to the single-phase fluid 120 and produce a two-phase fluid 124. The first two-phase heat transfer device 112 is further used to pump the two-phase fluid 124 to the condenser 114 via the inlet conduit 113. The condenser 114 is used to dissipate the generated heat to the atmosphere and produce the single-phase fluid 120. The heat dissipation system 110 is described in more detail below.

Figure 2:
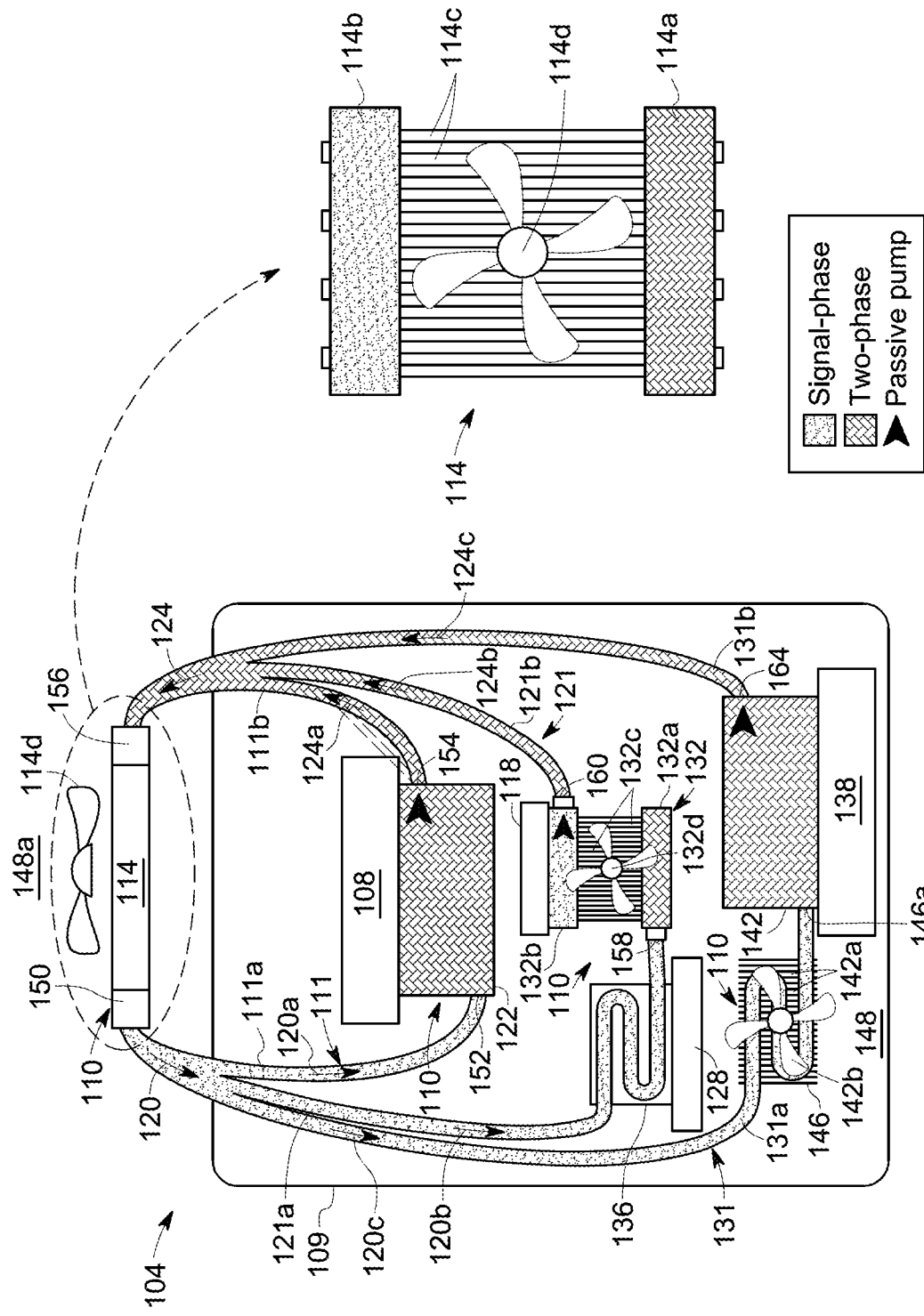
FIG. 2 is a schematic diagram of a power converter in accordance with one embodiment.

FIG. 2 illustrates a schematic diagram of the power converter 104 in accordance with one embodiment of the invention. In one embodiment, the power converter 104 includes a plurality of components such as the first component 108, a second component 118, a third component 128, a fourth component 138, the sealed casing 109, and the heat dissipation system 110. The first, second, third, and fourth components 108, 118, 128, 138, and a portion of the heat dissipation system 110 are disposed within the sealed casing 109. In one example embodiment, the sealed casing 109 is a hermetically sealed enclosure filled with a fluid, for example, inert gas, nitrogen, argon, and the like.

In one embodiment, the first, second, third, and fourth components 108, 118, 128, 138 may be power electronic components, such as inverters, converters and the like, and auxiliary components, such as inductors, bus bars laminates, and the like. In one embodiment, the first, second, and fourth components 108, 118, 138 are power electronic components and the third component 128 is an auxiliary component. In certain embodiments, the power electronic components may generate a substantially higher heat (or temperature) in comparison with the auxiliary component.

In one embodiment, the heat dissipation system 110 is a thermosiphon system. In the illustrated embodiment, the heat dissipation system 110 includes a first cooling loop 111, a second cooling loop 121, a third cooling loop 131, and a condenser 114. The condenser 114 is disposed outside the sealed casing 109. The first cooling loop 111 includes a first two-phase heat transfer device 122. In one embodiment, the first two-phase heat transfer device 122 is an evaporator disposed within the sealed casing 109. Further, the first two-phase heat transfer device 122 is configured to function as a first passive pump. It should be noted herein that the term "first passive pump" refers to the first two-phase heat transfer device 122, which is configured for indirectly pumping a two-phase fluid to the condenser 114. The first cooling loop 111 includes a first conduit 111a extending from a downstream end 150 of the condenser 114 to an upstream end 152 of the first two-phase heat transfer device 122 through the sealed casing 109. Similarly, the first cooling loop 111 further includes a second conduit 111b extending from a downstream end 154 of the first two-phase heat transfer device 122 to an upstream end 156 of the condenser 114 through the sealed casing 109.

The second cooling loop 121 includes a second two-phase heat transfer device 132 and a single-phase heat transfer device 136. The second two-phase heat transfer device 132 and the single-phase heat transfer device 136 are disposed within the sealed casing 109. The single-phase heat transfer device 136 is disposed upstream relative to the second two-phase heat transfer device 132. In one embodiment, the single-phase heat transfer device 136 is a cold plate coupled to the third component 128. The second two-phase heat transfer device 132 is a two-phase heat exchanger or an evaporator. The second two-phase heat transfer device 132 is coupled to the second component 118. The second two-phase heat transfer device 132 includes a first plenum 132a, a second plenum 132b, and a plurality of heat exchange tubes 132c extending between the first plenum 132a and the second plenum 132b. In one embodiment, the first and second plenums 132a, 132b are disposed parallel to one another. Further, the second plenum 132b is configured to function as a second passive pump. It should be noted herein that the term "second passive pump" refers to the second plenum 132b, which is configured to indirectly pumping the two-phase fluid to the condenser 114. In the illustrated embodiment, the second two-phase heat transfer device 132 further includes a fan 132d disposed over the plurality of heat exchange tubes 132c and configured to blow a fluid 148 along the plurality of heat exchange tubes 132c. The second cooling loop 121 further includes a third conduit 121a extending from the downstream end 150 of the condenser 114 to an upstream end 158 of the second two-phase heat transfer device 132 through the sealed casing 109. The second cooling loop 121 further includes a fourth conduit 121b extending from a downstream end 160 of the second two-phase heat transfer device 132 to the upstream end 156 of the condenser 114 through the sealed casing 109.

The third cooling loop 131 includes a third two-phase heat transfer device 142 and a single-phase heat transfer device 146. The third two-phase heat transfer device 142 and the single-phase heat transfer device 146 are disposed within the sealed casing 109. The single-phase heat transfer device 146 is disposed upstream relative to the third two-phase heat transfer device 142. In one embodiment, the single-phase heat transfer device 146 is a single-phase heat exchanger. The single-phase heat transfer device 146 includes a plurality of fins 146a and a fan 146b disposed over the plurality of fins 146a. The fan 146b is used to blow the fluid 148 over the plurality of fins 126a. The third two-phase heat transfer device 142 is an evaporator coupled to the fourth component 138. The third two-phase heat transfer device 142 is further to function as a third passive pump. It should be noted herein that the term "third passive pump" refers to the third two-phase heat transfer device 142, which is configured to indirectly pumping the two-phase fluid to the condenser 114. The third cooling loop 131 further includes a fifth conduit 131a extending from the downstream end 150 of the condenser 114 to an upstream end 162 of the third two-phase heat transfer device 142 through the sealed casing 109. The third cooling loop 131 further includes a sixth conduit 131b extending from a downstream end 164 of the third two-phase heat transfer device 142 to the upstream end 156 of the condenser 114 through the sealed casing 109. In one embodiment, the first, second, and third cooling loops 111, 121, 131 are disposed parallel to one another. It should be noted herein that in some embodiments, components of the first, second, and third cooling loops 111, 121, and 131 may be used interchangeably.

The condenser 114 includes a first plenum 114a, a second plenum 114b, and a plurality of heat exchange tubes 114c extending between the first plenum 114a and the second plenum 114b. In one embodiment, the first and second plenums 114a, 114b are disposed parallel to one another. The condenser 114 further includes a fan 114d disposed over the plurality of heat exchange tubes 114c and used to blow ambient air 148a on the plurality of heat exchange tubes 114c. The first plenum 114a is coupled to the downstream ends 154, 160, 164 of the first, second, and third two-phase heat transfer devices 112, 132, 143 respectively. Similarly, the second plenum 114b is coupled to the upstream ends 152, 158, 162 of the first, second, and third two-phase heat transfer devices 112, 132, 143 respectively. In one embodiment, the condenser 114 is disposed above the first, second, and third two-phase heat transfer devices 122, 132, 142. In some embodiments, the first conduit 111a, the second conduit 111b, the third conduit 121a, the fourth conduit 121b, the fifth conduit 131a, and the sixth conduit 131b are hermetically joined to the condenser 114. The first, second, and the third two-phase heat transfer devices 122, 132, 142 are hermetically sealed in the sealed casing 109 and pre-filled with a fluid at saturated liquid condition. In some other embodiments, the first conduit 111a, the second conduit 111b, the third conduit 121a, the fourth conduit 121b, the fifth conduit 131a, and the sixth conduit 131b may be not hermetically joined to the condenser 114. In such embodiments, the first, second, and the third two-phase heat transfer devices 122, 132, 142 may not be hermetically sealed in the sealed casing 109. Further, in such embodiments, the sealed casing 109 may be pre-filled with a fluid having a boiling point less than a predefined threshold temperature of the first, second, third, and fourth components 108, 118, 128, 138 at atmospheric pressure. In one such example embodiment, the fluid may include air, and the like.

During operation, the condenser 114 is used to direct a first portion 120a of the single-phase fluid 120 to the first two-phase heat transfer device 122 of the first cooling loop 111. In one embodiment, the single-phase fluid 120 may be water, nitrogen, or the like. The first two-phase heat transfer device 112 is configured to dissipate heat from the first component 108 to the first portion 120a of the single-phase fluid 120 and produce a first portion 124a of the two-phase fluid 124. In one embodiment, the two-phase fluid 124 includes a liquid medium and a gaseous medium. The first two-phase heat transfer device 112 is further configured to passively pump the first portion 124a of two-phase fluid 124 to the condenser 114.

The condenser 114 is further used to direct a second portion 120b of the single-phase fluid 120 to the single-phase heat transfer device 136 before directing the second portion 120b to the second two-phase heat transfer device 132. The single-phase heat transfer device 136 is used to extract heat from the third component 128 and heat the second portion 120b of the single-phase fluid 120 before directing the second portion 120b of the single-phase fluid 120 to the second two-phase heat transfer device 132. Specifically, the second portion 120b of the single-phase fluid 120 is directed to the first plenum 132a from the single-phase heat transfer device 136. The second portion 120b of the single-phase fluid 120 is then directed to the second plenum 132b through the plurality of heat exchange tubes 132c. The plurality of heat exchange tubes 132c dissipate heat from the second component 118 to the second portion 120b of the single-phase fluid 120 and produce a second portion 124b of the two-phase fluid 124. The second plenum 132b receives the second portion 124b from the plurality of heat exchange tubes 132c and passively pumps the second portion 124b of the two-phase fluid 124 to the condenser 114.

The condenser 114 is further used to direct a third portion 120c of the single-phase fluid 120 to the single-phase heat transfer device 146 before directing the third portion 120c to the third two-phase heat transfer device 142. The single-phase heat transfer device 146 is used to dissipate heat from the fluid 148 in the sealed enclosure and heat the third portion 120c before directing the third portion 120c of the single-phase fluid 120 to the third two-phase heat transfer device 142. The third two-phase heat transfer device 142 dissipates heat from the fourth component 138 and produces a third portion 124c of the two-phase fluid 124. The third two-phase heat transfer device 142 is further used to passively pump the third portion 124c of the two-phase fluid 124 to the condenser 114.

The condenser 114 is configured to receive the first, second, and third portions 124a, 124b, 124c of the two-phase fluid 124. Specifically, the first plenum 114a of the condenser 114 receives the first, second, and third portions 124a, 124b, 124c and mixes the first, second, and third portions 124a, 124b, 124c before directing the two-phase fluid 124 to the second plenum 114b via the plurality of heat exchange tubes 114c. The plurality of heat exchange tubes 114c is used to produce the single-phase fluid 120 by dissipating heat in the two-phase fluid 124 to the ambient air 148a. The fan 114d is used to blow the fluid 148 along the plurality of heat exchange tubes 114c to produce the single-phase fluid 120. As discussed herein, the first, second, and the third cooling loops 111, 121, 131 are configured to supply the first, second, and third portions 120a, 120b, 120c of the single-phase fluid 120 to the respective two-phase heat transfer devices 122, 132, 142. In some embodiments, the condenser 114 is configured to simultaneously direct the first, second, and third portions 120a, 120b, 120c of the single-phase fluid 120 to the respective first, second, and third two-phase heat transfer devices 122, 132, 142. In some other embodiments, the condenser 114 may be configured to sequentially direct the first, second, and third portions 120a, 120b, 120c of the single-phase fluid 120 to the respective first, second, and third two-phase heat transfer devices 122, 132, 142 depending on the corresponding temperature of the first, second, and fourth components 108, 118, 138.

Although, the heat dissipation system 110 illustrated in the embodiment of FIG. 2 includes three cooling loops 111, 121, 131, the number of such cooling loops may vary depend based on the design and application. The illustrated embodiment should not be construed as a limitation of the embodiment of the present invention. Although, each of the first, second, third cooling loops 111, 121, 131 illustrated in the embodiment of FIG. 2 includes one two-phase heat transfer device, the number of two-phase heat transfer device in each of the first, second, third cooling loops 111, 121, 131 may vary based on the design and application.

Figure 3:
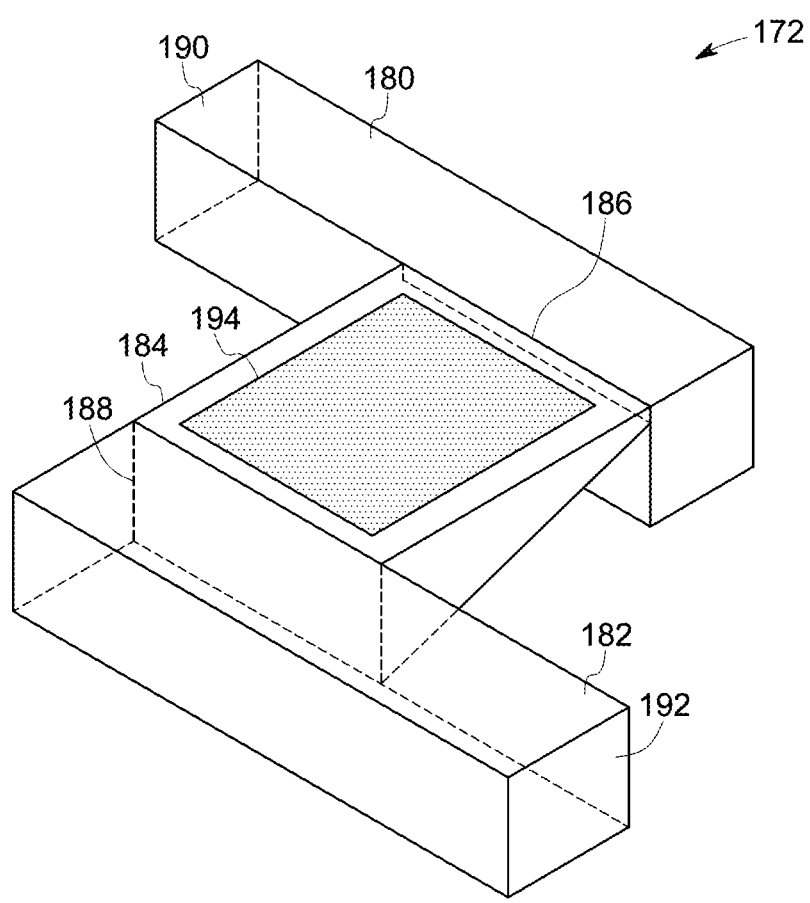
FIG. 3 is a perspective view of a two-phase heat transfer device in accordance with one embodiment.

FIG. 3 illustrates a perspective view of a two-phase heat transfer device 172 in accordance with one embodiment of the disclosed technique. The two-phase heat transfer device 172 is substantially similar to the first, second, and third two-phase heat transfer devices 122, 132, 142 as discussed in the embodiment of FIG. 2. The two-phase heat transfer device 172 includes a supply housing 180, a receiving housing 182, and an expansion housing 184 extending between the supply housing 180 and the receiving housing 182. The expansion housing 184 includes a flow inlet 186 coupled to the supply housing 180 and a flow outlet 188 coupled to the receiving housing 182. The supply housing 180 includes a first flow opening 190 defined therein and the receiving housing 182 includes a second flow opening 192 defined therein. In another embodiment, a plurality of two-phase heat transfer devices 172 may be coupled together to increase the cooling capacity of the heat dissipation system 110. Alternatively, as will be described in more detail below, the plurality of two-phase heat transfer devices 172 may be formed integrally as a unitary structure. In the illustrated embodiment, at least a portion of each of the supply housing 180 and the receiving housing 182 may be oriented perpendicular relative to the expansion housing 184. The plurality of two-phase heat transfer devices 172 may be spaced apart vertically.

As described herein, the single-phase fluid is directed from the condenser to the supply housing 180 through the first flow opening 190. The supply housing 180 directs the single-phase fluid to the expansion housing 184 through the flow inlet 186. The expansion housing 184 extracts heat from the corresponding components to the single-phase fluid and produce the two-phase fluid. The two-phase fluid is later discharged from the expansion housing 184 to the receiving housing 182 through the flow outlet 188. The receiving housing 182 discharges the two-phase fluid to the condenser through the second flow opening 192. As discussed herein, the expansion housing 184 is thermally coupled to a heat load 194. The heat transferred from the heat load 194 facilitates to vaporize the single-phase fluid to produce the two-phase fluid channeled through the expansion housing 184.

In the exemplary embodiment, expansion housing 184 has an asymmetric design such that flow inlet 186 has a smaller size compared to the size of the flow outlet 188. More specifically, the flow inlet 186 has a smaller cross-sectional area than the cross-sectional area of the flow outlet 188. When the single-phase fluid is vaporized, the volume of two-phase fluid increases in accordance with an Ideal Gas Law. The difference in cross sectional areas of the flow inlet 186 and the flow outlet 188 enables to accommodate the increased volume of the two-phase fluid channeled through the expansion housing 184 such that the two-phase fluid is forced towards the flow outlet 188 and backflow is restricted through the flow inlet 186. In one embodiment, a ratio of a cross-sectional area of the flow inlet 186 relative to a cross-sectional area of the flow outlet 188 is less than or equal to about 0.5.

Figure 4:
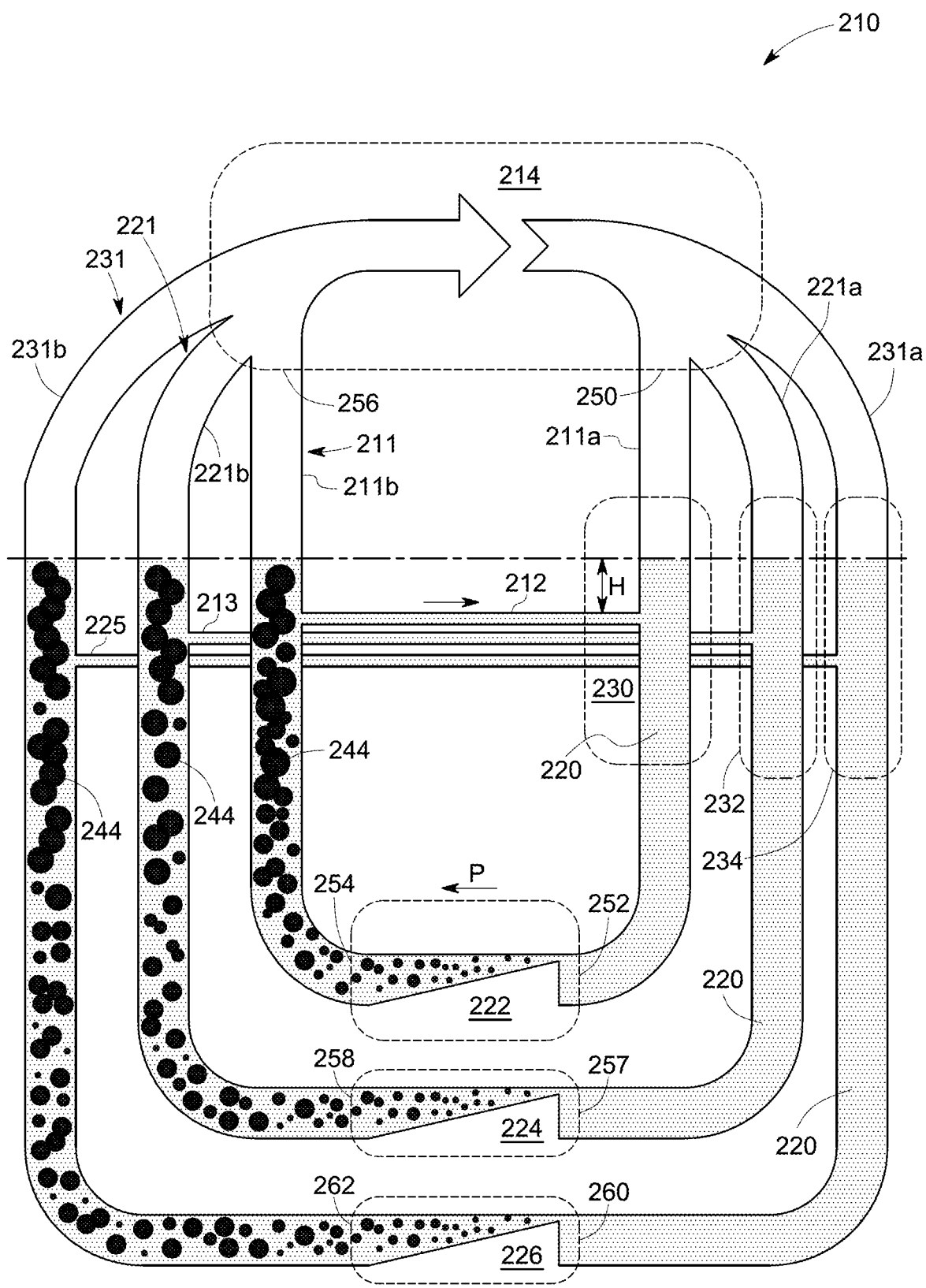
FIG. 4 is a schematic diagram of a heat dissipation system including an intermediate conduit in accordance with embodiment.

FIG. 4 illustrates a schematic diagram of a heat dissipation system 210 in accordance with one embodiment of the present invention. In the illustrated embodiment, the heat dissipation system 210 includes a first cooling loop 211, a second cooling loop 221, a third cooling loop 231, and a condenser 214. The first cooling loop 211 includes a first two-phase heat transfer device 222, and an accumulator 230. The first cooling loop 211 further includes a first conduit 211a extending from a downstream end 250 of the condenser 214 to an upstream end 252 of the first two-phase heat transfer device 222. Similarly, the first cooling loop 211 further includes a second conduit 211b extending from an upstream end 254 of the first two-phase heat transfer device 222 to a downstream end 256 of the condenser 214. The heat dissipation system 210 further includes a first intermediate conduit 212 coupled to the first conduit 211a and the second conduit 211b. The second cooling loop 221 includes a second two-phase heat transfer device 224, and an accumulator 232. The second cooling loop 221 further includes a third conduit 221a extending from the downstream end 250 of the condenser 214 to an upstream end 257 of the second two-phase heat transfer device 224. Similarly, the second cooling loop 221 further includes a fourth conduit 221b extending from an upstream end 258 of the second two-phase heat transfer device 224 to the downstream end 256 of the condenser 214. The heat dissipation system 210 further includes a second intermediate conduit 213 coupled to the third conduit 221a and the fourth conduit 221b. The third cooling loop 231 includes a third two-phase heat transfer device 226, and an accumulator 234. The third cooling loop 231 further includes a fifth conduit 231a extending from the downstream end 250 of the condenser 214 to an upstream end 260 of the third two-phase heat transfer device 226. Similarly, the third cooling loop 231 further includes a sixth conduit 231b extending from an upstream end 262 of the third two-phase heat transfer device 226 to the downstream end 256 of the condenser 214. The heat dissipation system 210 further includes a third intermediate conduit 225 coupled to the fifth conduit 231a and the sixth conduit 231b. Although, the first intermediate conduit 212, the second intermediate conduit 213, and the third intermediate conduit 225 are shown to be disposed in different plane, in certain embodiments, all three intermediate conduits 212, 213, 225 may be aligned in same plane. In some other embodiments, the heat dissipation system 210 may include only one accumulator coupled to the first, third, and fifth conduits 211a, 221a, 231a.

During operation, the condenser 214 is used to direct a first portion of a single-phase fluid 220 to the first two-phase heat transfer device 222 via the first conduit 211a, a second portion of the single-phase fluid 220 to the second two-phase heat transfer device 224 via the third conduit 221a, and a third portion of the single-phase fluid 220 to the third heat transfer device 226 via the fifth conduit 231a. The accumulator 230 is coupled to the first conduit 211a and used to temporarily store the first portion of the single-phase fluid 220 before supplying it to the first two-phase heat transfer device 222. Similarly, the accumulator 232 is coupled to the third conduit 221a and used to temporarily store the second portion of the single-phase fluid 220 before supplying it to the second two-phase heat transfer device 224. The accumulator 234 is coupled to the fifth conduit 231a and used to temporarily store the third portion of the single-phase fluid 220 before supplying it to the third two-phase heat transfer device 226. The first two-phase heat transfer device 222 which is coupled to a first component (not shown in FIG. 4), is configured to dissipate heat from the first component to the first portion of the single-phase fluid 220 and produce a first portion of a two-phase fluid 224. The first two-phase heat transfer device 222 is further configured to passively pump the first portion of the two-phase fluid 224 to the condenser 214. During continued operation of the heat dissipation system 210, a level of the first portion of the single-phase fluid 220 in the first conduit 211a is reduced and a level of the first portion of the two-phase fluid 224 in the second conduit 211b is increased, thereby generating a head height "H" between the levels of the single-phase fluid 220 and the two-phase fluid 224 in the first cooling loop 211. The generation of the head height "H" may result in choking the first two-phase heat transfer device 222. It should be noted herein that the term "choking" as used in the context described herein refers to cutting off the supply of the single-phase fluid 220 to the first two-phase heat transfer device 222. In accordance with the exemplary embodiment, the first intermediate conduit 212 is configured to transfer at least a portion of the first portion of the two-phase fluid 224 from the second conduit 211b to the first conduit 211a, thereby allowing the first cooling loop 211 to maintain the level of the single-phase fluid 220 in the first conduit 211a equal to the level of the two-phase fluid 224 in the second conduit 211b. Thereby, the first intermediate conduit 212 enables to prevent choking of the first two-phase heat transfer device 222. Similarly, the second two-phase heat transfer device 224 which is coupled to a second component (not shown in FIG. 4), is configured to dissipate heat from the second component to the second portion of the single-phase fluid 220 and produce a second portion of the two-phase fluid 224. The second two-phase heat transfer device 224 is further configured to passively pump the second portion of the two-phase fluid 224 to the condenser 214. As discussed herein, the second intermediate conduit 213 is configured to transfer at least a portion of the second portion of the two-phase fluid 224 from the fourth conduit 221b to the third conduit 221a, thereby allowing the second cooling loop 221 to maintain a level of the single-phase fluid 220 in the third conduit 221a equal to a level of the two-phase fluid 224 in the fourth conduit 221b. Thereby, the second intermediate conduit 213 enables to prevent choking of the second two-phase heat transfer device 224. Similarly, the third intermediate conduit 225 is configured to transfer at least a portion of the third portion of the two-phase fluid 224 from the sixth conduit 231b to the fifth conduit 231a, thereby allowing the third cooling loop 231 to maintain a level of the single-phase fluid 220 in the fifth conduit 231a equal to a level of the two-phase fluid 224 in the sixth conduit 231b. Thereby, the third intermediate conduit 225 enables to prevent choking of the third two-phase heat transfer device 226. Although, the embodiment of FIG. 4 is discussed with three intermediate conduits 212, 213, 225, in some embodiments, the heat dissipation system 210 may include only one intermediate conduit connecting the first, third, and fifth conduits 211a, 221a, 231a with the second, fourth, and sixth conduits 211b, 221b, 231b. Similarly, in some other embodiments, the number of such cooling loops in the heat dissipation system 210 may vary depending on the application.

Figure 5:
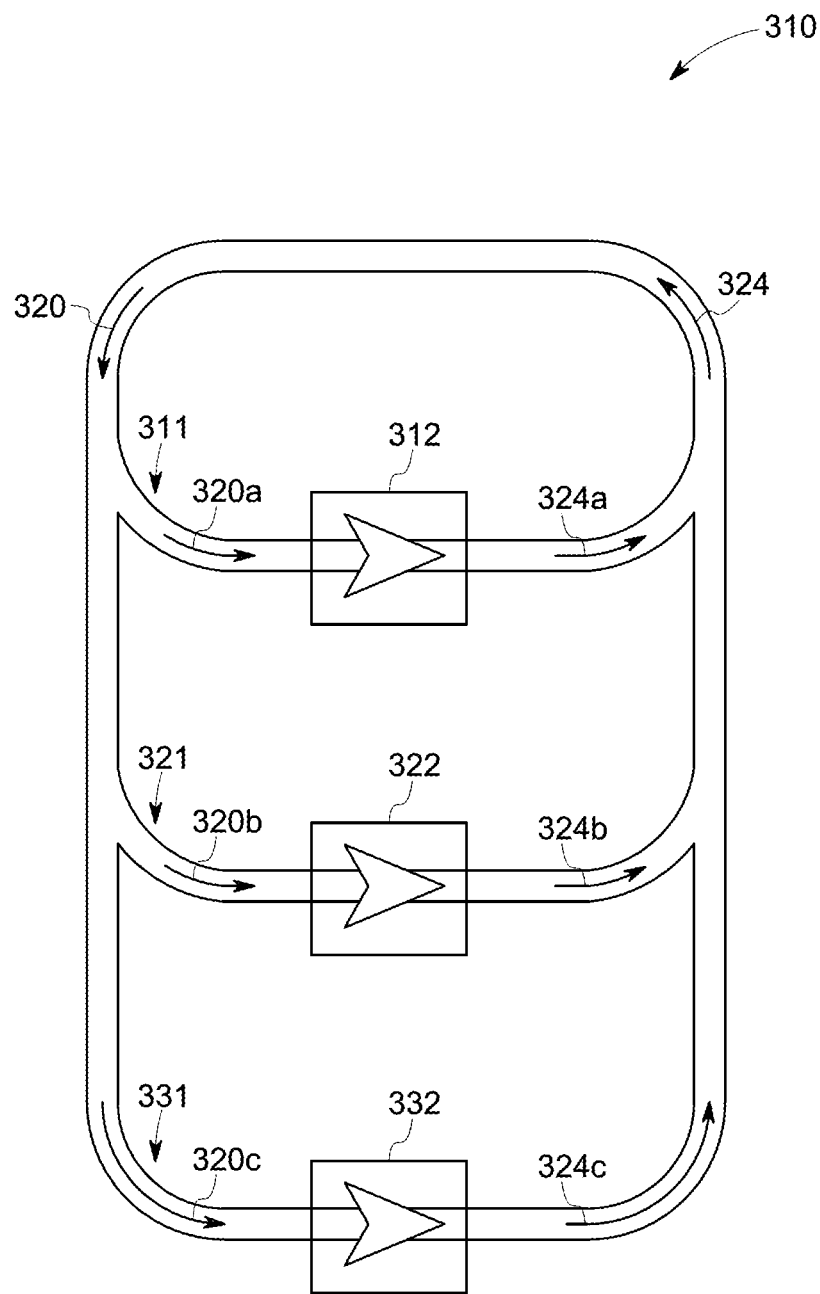
FIG. 5 is a schematic diagram of a heat dissipation system in accordance with one embodiment.

FIG. 5 illustrates a schematic diagram of a heat dissipation system 310 in accordance with one embodiment of the present invention. In the illustrated embodiment, the heat dissipation system 310 includes a first cooling loop 311, a second cooling loop 321, and a third cooling loop 331. For ease of illustration, the condenser is not shown in the embodiment of FIG. 5. The first cooling loop 311 includes a first two-phase heat transfer device 312, the second cooling loop 321 includes a second two-phase heat transfer device 322, and the third cooling loop 331 includes a third two-phase heat transfer device 332. The first two-phase heat transfer device 312 receives a first portion 320a of a single-phase fluid 320 from the condenser and produce a first portion 324a of a two-phase fluid 324. Similarly, the second two-phase heat transfer device 322 receives a second portion 320b of the single-phase fluid 320 from the condenser and produce a second portion 324b of the two-phase fluid 324. The third two-phase heat transfer device 332 is receives a third portion 320c of the single-phase fluid 320 from the condenser and produce a third portion 324c of the two-phase fluid 324. It should be noted herein that the first portion 324a, the second portion 324b, and the third portion 324c of the two-phase fluid 324 are produced by exchanging heat with respective electronic components and/or the fluid within a sealed casing. In certain embodiments, the heat dissipation system 310 is configured to perform at least one of regulating a flow rate of the single-phase fluid 320 and the two-phase fluid 324 in the first, second, and third cooling loops 311, 321, 331 by passively pumping the first, second, and third portions 324a, 324b, 324c of the two-phase fluid 324 by each of the two-phase heat transfer device 312, 322, 332. Specifically, the first portion 320a of the single-phase fluid 320 and the first portion 324a of a two-phase fluid 324 in the first cooling loop 311 is passively pumped by first two-phase heat transfer device 312 to regulate the flow rate of the single-phase fluid 320 and the two-phase fluid 324. Similarly, the second portion 320b of the single-phase fluid 320 and the second portion 324b of the two-phase fluid 324 in the second cooling loop 321 is passively pumped by the second two-phase heat transfer device 322 to regulate the flow rate of the single-phase fluid 320 and the two-phase fluid 324 in the second cooling loop 321. Further, the third portion 320c of the single-phase fluid 320 and the third portion 324c of the two-phase fluid 324 in the third cooling loop 331 is passively pumped by the third two-phase heat transfer device 332 to regulate the flow rate of the single-phase fluid 330 and the two-phase fluid 334 in the third cooling loop 331. In accordance with the embodiments of the present invention, there is no need for use of active pumps for pumping the two-phase fluid from two-phase heat transfer devices 312, 322, 332.

Figure 6:
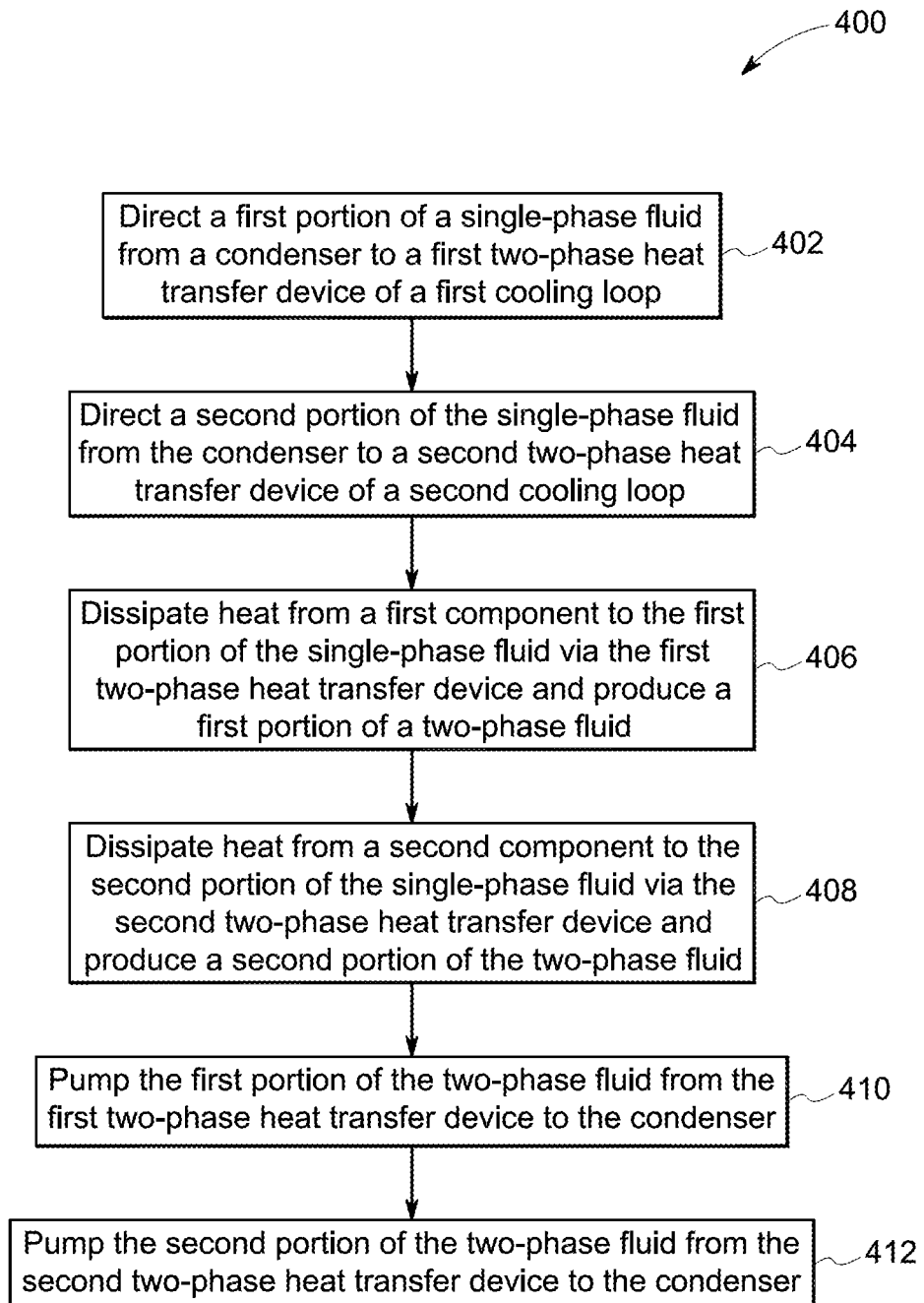
FIG. 6 is a flow diagram of a method of thermal management of a power converter in accordance with one example embodiment.

FIG. 6 illustrates a flow diagram of a method 400 of a thermal management of a power converter in accordance with one embodiment. In one embodiment, the method 400 involves directing a first portion of a single-phase fluid from a condenser to a first two-phase heat transfer device of a first cooling loop at step 402. In certain embodiments, the single-phase fluid includes a liquid medium. In one embodiment, the power converter includes a sealed casing and the condenser is disposed outside the sealed casing. The method 400 further involves directing a second portion of the single-phase fluid from the condenser to a second two-phase heat transfer device of a second cooling loop at step 404. Further, the method 400 involves dissipating heat from a first component to the first portion of the single-phase fluid via the first two-phase heat transfer device and produce a first portion of a two-phase fluid at step 406. The first component is disposed within the sealed casing and coupled to the first two-phase heat transfer device. In certain embodiments, the two-phase fluid includes a liquid medium and a gaseous medium. The method 400 further involves a step 408 of dissipating heat from a second component to the second portion of the single-phase fluid via the second two-phase heat transfer device and produce a second portion of the two-phase fluid. In one example embodiment, the second component is disposed within the sealed casing and coupled to the second two-phase heat transfer device. The method 400 further involves pumping the first portion of the two-phase fluid from the first two-phase heat transfer device to the condenser at step 410. In one embodiment, the first two-phase heat transfer device is configured to passively pump the first portion of the two-phase fluid to the condenser. The method 400 further involves pumping the second portion of the two-phase fluid from the second two-phase heat transfer device to the condenser at step 412. In one embodiment, the second two-phase heat transfer device is configured to passively pump the second portion of the two-phase fluid to the condenser. In some embodiments, the first and second cooling loops are disposed parallel to one another. In some embodiments, the method 400 further involves a step of dissipating heat from a third component to the second portion of the single-phase fluid via a single-phase heat transfer device of the second cooling loop before directing the second portion of the single-phase fluid to the second two-phase heat transfer device. In one embodiment, the third component and the single-phase heat transfer device are disposed within the sealed casing. Further, the single-phase heat transfer device is coupled to the third component.

In one embodiment, the method 400 further involves a sub-step (i) of directing a third portion of the single-phase fluid from the condenser to a third two-phase heat transfer device of a third cooling loop, a sub-step (ii) of dissipating heat from a fourth component to the third portion of the single-phase fluid via a third two-phase heat transfer device of the third cooling loop and producing a third portion of the two-phase fluid, and sub-step (iii) of pumping the third portion of the two-phase fluid from the third two-phase heat transfer device to the condenser. In some embodiments, the fourth component and the third two-phase heat transfer device are disposed within the sealed casing. Further, the fourth component is coupled to the third two-phase heat transfer device. In one example embodiment, the method further involves a sub-step (iv) of dissipating heat from a fluid in the sealed casing to the third portion of the single-phase fluid via a single-phase heat transfer device of the third cooling loop before directing the third portion of the single-phase fluid to the third two-phase heat transfer device. In such an embodiment, the single-phase heat transfer device is disposed within the sealed casing. In some embodiments, the first, second, and third cooling loops are disposed parallel to one another.

In one or more embodiments, the method 400 further involves performing at least one of i) transferring a portion of the first portion of the two-phase fluid from a first conduit to a second conduit of the first cooling loop, ii) transferring a portion of the second portion of the two-phase fluid from a third conduit to a fourth conduit of the second cooling loop, and iii) transferring a portion of the third portion of the two-phase fluid from a fifth conduit to a sixth conduit of the third cooling loop. In such embodiments, the first conduit extends from a downstream end of the first two-phase heat transfer device to an upstream end of the condenser and the second conduit extends from a downstream end of the condenser to an upstream end of the first two-phase heat transfer device. The third conduit extends from a downstream end of the second two-phase heat transfer device to the upstream end of the condenser and the fourth conduit extends from the downstream end of the condenser to an upstream end of the second two-phase heat transfer device. The fifth conduit extends from a downstream end of the third two-phase heat transfer device to the upstream end of the condenser and the sixth conduit extends from the downstream end of the condenser to an upstream end of the third two-phase heat transfer device.

In one or more embodiments, the method 400 further involves performing at least one of i) regulating a flow rate of the first portion of the single-phase fluid and the first portion of the two-phase fluid in the first cooling loop using a first two-phase heat transfer device, ii) regulating a flow rate of the second portion of the single-phase fluid and the second portion of the two-phase fluid in the second cooling loop using the second two-phase heat transfer device, and iii) regulating a flow rate of the third portion of the single-phase fluid and the third portion of the two-phase fluid in the third cooling loop using the third two-phase heat transfer device.

While only certain features of embodiments have been illustrated and described herein, many modifications and changes will occur to those skilled in the art. It is, therefore, to be understood that the appended embodiments are intended to cover all such modifications and changes as falling within the spirit of the disclosed technique.

The invention claimed is:

1. A heat dissipation system comprising:
   a condenser comprising an upstream end and a downstream end;
   a first cooling loop coupled to the condenser, wherein the first cooling loop comprises:
      a first two-phase heat transfer device coupled to a first component of a power converter; and
      a first conduit coupled in flow communication with the upstream end and the downstream end of the condenser; and
   a second cooling loop coupled to the condenser, wherein the second cooling loop comprises:
      a second two-phase heat transfer device coupled to a second component of the power converter;
      a second conduit coupled in flow communication with the upstream end and the downstream end of the condenser; and
      a single-phase heat transfer device coupled to a third component of the power converter, the single-phase heat transfer device further being coupled to and disposed upstream relative to the second two-phase heat transfer device, wherein the condenser is disposed above the first and second two-phase heat transfer devices and is configured to receive a two-phase fluid from the first cooling loop and the second cooling loop at the upstream end and discharge a single-phase fluid at the downstream end to the first cooling loop and the second cooling loop, wherein the first and second components are power electronics components of the power converter and the third component is an auxiliary component of the power converter, wherein the first and second components are configured to generate substantially more heat than the third component.

2. The heat dissipation system of claim 1, further comprising a third cooling loop coupled to the condenser, wherein the third cooling loop comprises a third two-phase heat transfer device, wherein the first and second components are each at least one of a power electronics inverter and a power electronics converter, and wherein the third component is at least one of an inductor and a bus bar laminate.

3. The heat dissipation system of claim 2, wherein the third cooling loop further comprises a second single-phase heat transfer device coupled to and disposed upstream relative to the third two-phase heat transfer device.

4. The heat dissipation system of claim 2, wherein the first conduit of the first cooling loop extends from the downstream end of the condenser to an upstream end of the first two-phase heat transfer device, the first cooling loop further comprising a third conduit extending from a downstream end of the first two-phase heat transfer device to the upstream end of the condenser,
   wherein the second conduit of the second cooling loop extends from the downstream end of the condenser to an upstream end of the second two-phase heat transfer device, the second cooling loop further comprising a fourth conduit extending from a downstream end of the second two-phase heat transfer device to the upstream end of the condenser, and
   wherein the third cooling loop comprises a fifth conduit extending from the downstream end of the condenser to an upstream end of the third two-phase heat transfer device and a sixth conduit extending from a downstream end of the third two-phase heat transfer device to the upstream end of the condenser.

5. The heat dissipation system of claim 4, further comprising at least one of:
   a first intermediate conduit coupled to the first conduit and the third conduit,
   a second intermediate conduit coupled to the second conduit and the fourth conduit, and
   a third intermediate conduit coupled to the fifth conduit and the sixth conduit.

6. The heat dissipation system of claim 1, wherein the first two-phase heat transfer device is adapted to dissipate heat from the first component, the second two-phase heat transfer device is adapted to dissipate heat from the second component, and the single-phase heat transfer device is adapted to dissipate heat from the third component.

7. The heat dissipation system of claim 1, wherein the second two-phase heat transfer device includes a first plenum, a second plenum, a plurality of heat exchange tubes extending between the first plenum and the second plenum, and a fan configured to blow a fluid along the plurality of heat exchange tubes.

8. The heat dissipation system of claim 7, wherein the single-phase heat transfer device comprises a cold plate.

9. A power converter comprising:
   a sealed casing;
   a first component, a second component, and a third component disposed within the sealed casing, wherein the first and second components are power electronics components of the power converter and the third component is an auxiliary component of the power converter, and wherein the first and second components are configured to generate substantially more heat than the third component; and
   a heat dissipation system comprising:
      a condenser disposed outside the sealed casing, the condenser comprising an upstream end and a downstream end;
      a first cooling loop coupled to the condenser, wherein the first cooling loop comprises a first two-phase heat transfer device disposed within the sealed casing and coupled to the first component, the first cooling loop further comprising a first conduit coupled in flow communication with the upstream end and the downstream end of the condenser; and
      a second cooling loop coupled to the condenser, wherein the second cooling loop comprises:
         a second two-phase heat transfer device disposed within the sealed casing and coupled to the second component;
         a second conduit coupled in flow communication with the upstream end and the downstream end of the condenser, wherein the condenser is disposed above the first and second two-phase heat transfer devices, the condenser being configured to receive a two-phase fluid from the first cooling loop and the second cooling loop at the upstream end and discharge a single-phase fluid at the downstream end to the first cooling loop and the second cooling loop; and
         a single-phase heat transfer device coupled to the third component and further coupled to and disposed upstream relative to the second two-phase heat transfer device, wherein the first two-phase heat transfer device is configured to passively maintain a flow rate of a first portion of the single-phase fluid and a first portion of the two-phase fluid in the first cooling loop, wherein the second two-phase heat transfer device is configured to passively maintain a flow rate of a second portion of the single-phase fluid and a second portion of the two-phase fluid in the second cooling loop, and wherein the single-phase fluid includes a liquid medium and the two-phase fluid includes the liquid medium and a gaseous medium.

10. The power converter of claim 9, further comprising:
a fourth component; and
a third cooling loop coupled to the condenser, wherein the third cooling loop comprises a third two-phase heat transfer device disposed within the sealed casing, and wherein the third two-phase heat transfer device is coupled to the fourth component.

11. The power converter of claim 10, wherein the third cooling loop further comprises a second single-phase heat transfer device coupled to and disposed upstream relative to the third two-phase heat transfer device.

12. The power converter of claim 10, wherein the first conduit of the first cooling loop extends from the downstream end of the condenser to an upstream end of the first two-phase heat transfer device, the first cooling loop further comprising a third conduit extending from a downstream end of the first two-phase heat transfer device to the upstream end of the condenser,
wherein the second conduit of the second cooling loop extends from the downstream end of the condenser to an upstream end of the second two-phase heat transfer device, the second cooling loop further comprising a fourth conduit extending from a downstream end of the second two-phase heat transfer device to the upstream end of the condenser, and
wherein the third cooling loop comprises a fifth conduit extending from the downstream end of the condenser to an upstream end of the third two-phase heat transfer device and a sixth conduit extending from a downstream end of the third two-phase heat transfer device to the upstream end of the condenser.

13. The power converter of claim 12, further comprising at least one of:
a first intermediate conduit coupled to the first conduit and the third conduit,
a second intermediate conduit coupled to the second conduit and the fourth conduit, and
a third intermediate conduit coupled to the fifth conduit and the sixth conduit.

14. The power converter of claim 9, wherein the second two-phase heat transfer device includes a first plenum, a second plenum, a plurality of heat exchange tubes extending between the first plenum and the second plenum, and a fan configured to blow an ambient fluid along the plurality of heat exchange tubes.

15. A power converter comprising:
a sealed casing;
a first component, a second component, and a third component disposed within the sealed casing, wherein the first and second components are power electronics components of the power converter and the third component is an auxiliary component of the power converter, wherein the first and second components are configured to generate substantially more heat than the third component; and
a heat dissipation system comprising:
a condenser disposed outside the sealed casing, the condenser comprising an upstream end and a downstream end;
a first cooling loop coupled to the condenser, wherein the first cooling loop comprises a first two-phase heat transfer device disposed within the sealed casing and coupled to the first component, the first cooling loop further comprising a first conduit coupled in flow communication with the upstream end and the downstream end of the condenser; and
a second cooling loop coupled to the condenser, the second cooling loop comprising:
a second two-phase heat transfer device disposed within the sealed casing and coupled to the second component, wherein the condenser is disposed above the first and second two-phase heat transfer devices and is configured to receive a two-phase fluid from the first cooling loop and the second cooling loop at the upstream end and discharge a single-phase fluid at the downstream end to the first cooling loop and the second cooling loop;
a second conduit coupled in flow communication with the upstream end and the downstream end of the condenser; and
a single-phase heat transfer device coupled to the third component, the single-phase heat transfer device further coupled to and disposed upstream relative to the second two-phase heat transfer device;
wherein the sealed casing is hermetically sealed, wherein the first cooling loop and the second cooling loop are hermetically joined to the condenser, and wherein the sealed casing is filled with a fluid in a saturated liquid condition.

16. The power converter of claim 15, further comprising:
a fourth component; and
a third cooling loop coupled to the condenser, wherein the third cooling loop comprises a third two-phase heat transfer device disposed within the sealed casing, wherein the third two-phase heat transfer device is coupled to the fourth component, wherein the first and second components are each at least one of a power electronics inverter and a power electronics converter, and wherein the third component is at least one of an inductor and a bus bar laminate.

17. The power converter of claim 16, wherein the third cooling loop further comprises a second single-phase heat transfer device coupled to and disposed upstream relative to the third two-phase heat transfer device.

18. The power converter of claim 17, wherein the first conduit of the first cooling loop extends from the downstream end of the condenser to an upstream end of the first two-phase heat transfer device, the first cooling loop further comprising a third conduit extending from a downstream end of the first two-phase heat transfer device to the upstream end of the condenser,
wherein the second conduit of the second cooling loop extends from the downstream end of the condenser to an upstream end of the second two-phase heat transfer device, the second cooling loop further comprising a fourth conduit extending from a downstream end of the second two-phase heat transfer device to the upstream end of the condenser, and
wherein the third cooling loop comprises a fifth conduit extending from the downstream end of the condenser to an upstream end of the third two-phase heat transfer device and a sixth conduit extending from a downstream end of the third two-phase heat transfer device to the upstream end of the condenser.

19. The power converter of claim 18, further comprising at least one of:
   a first intermediate conduit coupled to the first conduit and the third conduit,
   a second intermediate conduit coupled to the second conduit and the fourth conduit, and
   a third intermediate conduit coupled to the fifth conduit and the sixth conduit.

* * * * *